(12) United States Patent
Boone et al.

(10) Patent No.: US 6,294,447 B1
(45) Date of Patent: Sep. 25, 2001

(54) METHOD OF MAKING DEVICES HAVING THIN DIELECTRIC LAYERS

(75) Inventors: Thomas Boone, Whitehouse Station; Joseph Mark Rosamilia, Berkeley Heights, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/351,971

(22) Filed: Jul. 12, 1999

(51) Int. Cl.[7] ................................................ H01L 21/3205
(52) U.S. Cl. ........................ 438/585; 438/594; 438/770; 438/301
(58) Field of Search ................................. 438/585, 594, 438/770, 301, 593

(56) References Cited

U.S. PATENT DOCUMENTS

| | | |
|---|---|---|
| 4,552,595 | 11/1985 | Hoga . |
| 4,814,291 * | 3/1989 | Kim et al. ............................ 438/593 |
| 5,670,396 * | 9/1997 | Shibib ................................... 438/594 |
| 5,780,342 | 7/1998 | Wang . |
| 5,851,888 * | 12/1998 | Gardner et al. ...................... 438/770 |

* cited by examiner

*Primary Examiner*—Charles Bowers
*Assistant Examiner*—Yennhu B. Huynh
(74) *Attorney, Agent, or Firm*—Lowenstein Sandler PC

(57) ABSTRACT

A method for making a thin dielectric layer is disclosed which is useful in fabricating semiconductor devices, particularly transistors and DRAM cell devices. The method comprises a two-steps, i.e., (i) growing a base layer of dielectric material on a substrate having a thickness in excess of the desired thickness for the layer, and (ii) etching back the base layer to the desired thickness. With these two steps, a thin dielectric layer of less than 20 Å may be provided having substantial uniformity across its surface with a standard deviation in surface contours of less than 0.7 Å.

11 Claims, 3 Drawing Sheets

METHOD OF MAKING DEVICES HAVING THIN DIELECTRIC LAYERS

FIELD OF THE INVENTION

The present invention relates to a method for making devices including semiconductor devices having thin dielectric layers and, in particular, to a process for growing dielectric layers that are ultra-thin and have improved quality.

BACKGROUND OF THE INVENTION

As microelectronic circuits become increasingly integrated, the demand for smaller components becomes stronger. The quest for miniaturization is particularly ardent with regard to transistors and memory devices such as dynamic random access memory (DRAM) cell structures. The metal-oxide semiconductor field-effect transistor (MOSFET or MOS device) is a dominant and important device in fabricating memory devices and integrated circuits, and various types of MOSFETS are known. MOSFET technology includes NMOS and CMOS technology, the former comprising n-channel MOS devices and the latter comprising n-channel and p-channel devices integrated on the same chip. Other acronyms are used to identify MOSFETs, including DMOS (wherein "D" stands for "diffusion" or "double diffusion"), PMOS (p-channel MOS), IGBT (Insulated Gate Bipolar Transistor), BiCMOS (CMOS having bipolar devices), and DGDMOS (Dual Gate DMOS). MOS devices may be integrated together or with other components or devices to form memory cells, such as DRAM cells, static random access memory (SRAM) cells, and flash electrically-programmable read-only memory (EPROM) cells.

A basic structural feature of transistors involves a dielectric or insulating layer. The migration of integrated circuits to smaller feature sizes is driving interest in developing thin film dielectrics and in particular, in producing dielectric layers that are thinner than 20 Å. As the cell size has shrunk, designers have attempted to produce such "ultra-thin" dielectric films, but processing constraints make it difficult to obtain uniform, high-quality reproducible dielectric films of this size. Typically, dielectric layers have been fabricated with a —$SiO_x$, usually $SiO_2$, although new materials for use in dielectrics are being developed having higher dielectric constants. See, e.g., U.S. Pat. No. 5,658,485 for "Pyrochlore Based Oxides With High Dielectric Constant And Low Temperature Coefficient," and U.S. Pat. No. 5,552,355 for "Compensation of the Temperature Coefficient of the Dielectric Constant of Barium Strontium Titanate," both of which are assigned to the present assignee.

Presently, there are two approaches which are most often used for growing thin film dielectric layers and particularly $SiO_2$ films, i.e., rapid thermal oxidation (RTO) and furnace oxidation. Both these approaches have limitations. Generally with RTO, a silicon substrate is oxidized with $O_2$ gas for a short period of time at high temperatures. Temperatures of about 1000° C. are used, and a radiant heater, such as a flashlamp heater apparatus, may be used to rapidly (e.g., within five minutes) produce the transition from a relatively low temperature (e.g., about 650° C.) to the oxidation temperature. The RTO equipment is not sufficiently robust for use in manufacturing processes, however, and the growth conditions may limit the potential for good properties at the Si—$SiO_2$ interface.

With furnace oxidation, typically wafers are held within a reaction tube and heated while gases are passed over them. Furnace oxidation processes generally operate at lower sacrificial dielectric layer, annealing the permanent layer in Argon or $N_2$, and thereafter forming gate structures on the dielectric. This method has disadvantages in that it is restricted to formation of dielectrics with nitrogen-bearing species and requires a separate anneal step in which the substrate is subjected to temperatures of 500 to 950° C.

As may be appreciated, those involved in the field of semiconductors and in particular dielectric materials continue to seek to develop technologies for growing thin film dielectrics.

SUMMARY OF THE INVENTION

Summarily described, the invention comprises a method for making a thin dielectric layer for use in fabricating a semiconductor device, e.g., a transistor having a source, a drain, a channel running from source to the drain, a dielectric layer, and a gate electrode. The method of making the dielectric layer comprises a two-step process consisting of (i) growing a base layer of dielectric material on a substrate having a thickness in excess of the desired thickness for the layer, and (ii) etching back the base layer to the desired thickness. With this invention, it is not necessary that the dielectric layer be grown in the presence of a nitrogen ambient or that an anneal step be performed.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

Figure 1:
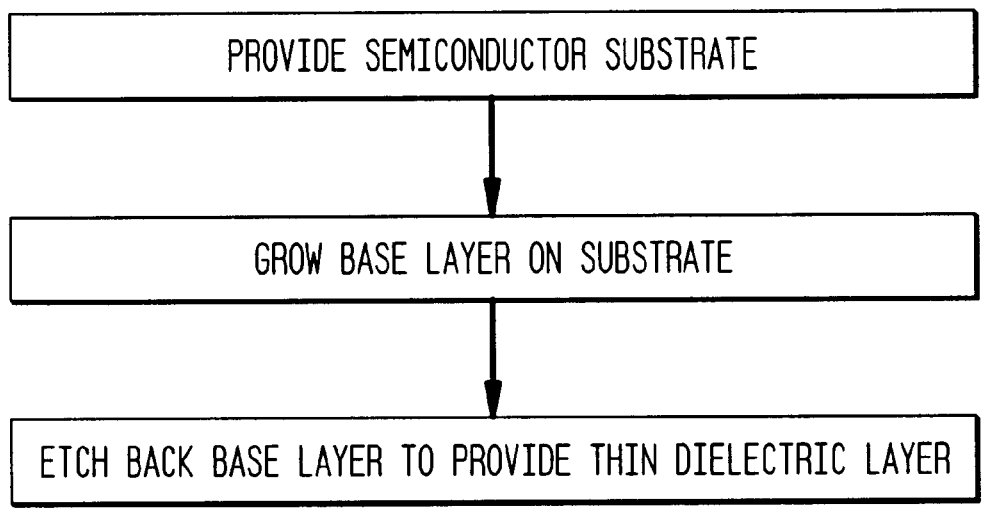
FIG. 1 is a block diagram showing the steps of the inventive method.

With this invention, a two-step process is provided for growing a thin-film dielectric layer of high quality. The two-step process consists of (i) growing a base layer of dielectric material on a substrate having a thickness in excess of the desired thickness for the layer (FIG. 1, block 2) and (ii) etching back the base layer to the desired thickness (FIG. 1, block 3). The substrate (FIG. 1, block 1), may have source, drain and gate regions disposed therein prior to growing the base layer, and polysilicon gate electrodes may be deposited on the dielectric layer or on the substrate. The formation of the thin dielectric layer of this invention may be incorporated into various technologies used to make MOS devices, such as described in the following U.S. patents, all of which were assigned to the present assignee and are hereby incorporated herein by reference: U.S. Pat. No. 5,670,396, "Method of Forming a DMOS-Controlled Lateral Bipolar Transistor," issued Sep. 23, 1997; U.S. Pat. No. 5,557,125, "Dielectrically Isolated Semiconductor Devices Having Improved Characteristics," issued Sep. 17, 1996; U.S. Pat. No. 5,395,776, "Method of Making a Rugged DMOS Device," issued Mar. 7, 1995; U.S. Pat. No. 5,381,031, "Semiconductor Device With Reduced High Voltage Termination Area and High Breakdown Voltage," issued Jan. 10, 1995.

In performing the inventive method of this invention, the first step involves growing the initial base layer (FIG. 1, block 2). The initial base layer is a relatively thick oxide layer, preferably a $SiO_2$ layer, grown by furnace oxidation. By "relatively thick" it is meant the layer has a thickness ranging from about 50 Å to about 200 Å, and preferably it has a thickness of about 100 Å. In growing the base layer, it is not necessary that a precise thickness be achieved, as this layer will be etched back, which is advantageous as flexibility is provided with regard to the initial oxide thickness. Also, in forming the base layer, a variety of temperature ranges and gas compositions can be applied to control the growth conditions and gate oxide quality. For example, during the furnace oxidation temperatures in the range of about 750° C. to 1100° C. may be used, and more preferably in the range of 900° C. to 1100° C. The furnace oxidation is performed with gas compositions comprising dry oxygen $O_2$ or $SiH_4+O_2$, or other compositions known in the field. A nitrogen-bearing ambient is not required.

In the second step of the method (FIG. 1, block 3), the base layer is etched back to the desired thickness applying wet chemical etchants such as HF, $K_4Fe(CN)_6$, $K_3Fe(CN)_6$, $Na_2S_2O_3$, KOH in $H_2O$, or other etchants known in the field. Preferably, a dilute HF etchant is used, e.g., comprising 1 part HF to 200 parts $H_2O$. With this approach, the base layer may be etched back to ~20 Å or even down to ~15 Å, maintaining a high-quality film. Thus, this two-step approach provides thin films with reduced surface defect states and additionally, it is flexible, particularly in comparison with previous RTO methods. With this invention, it is not necessary that a separate anneal step be performed. The gate formation may be performed directly on the thin dielectric layer that remains following the etch-back step.

Figure 2A:
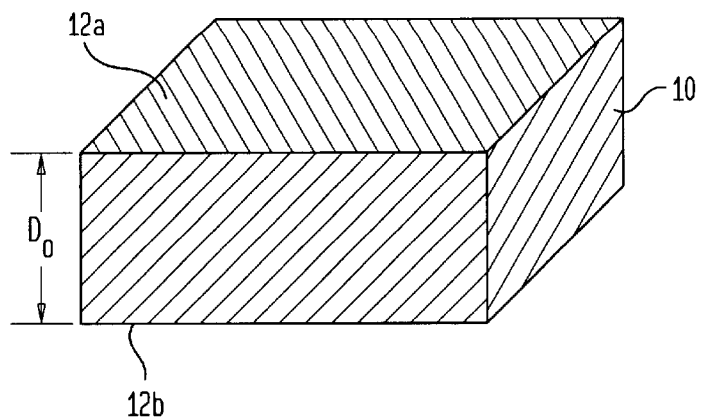
FIGS. 2A–2C schematically illustrate the formation of a thin-film dielectric layer on a substrate applying steps of the inventive method.
Figure 2B:
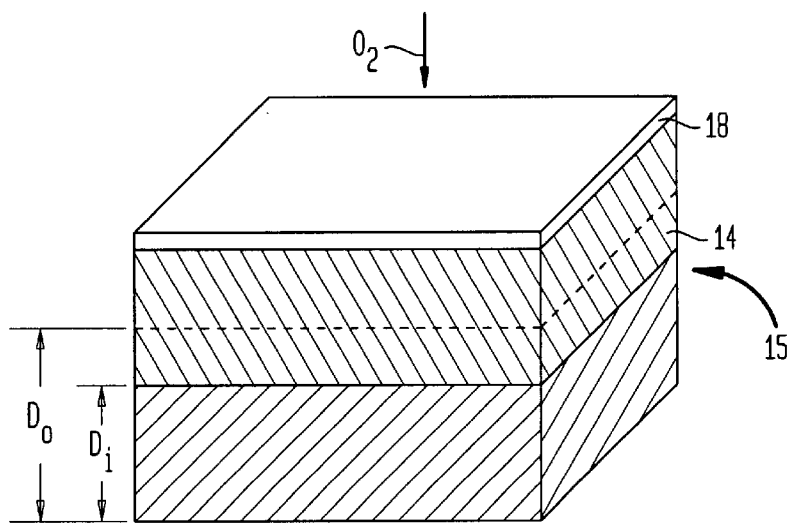
Figure 2C:
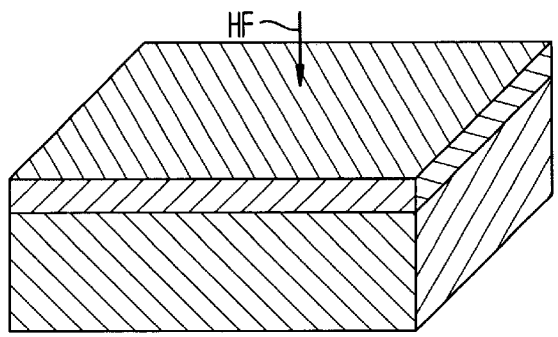

With reference to FIGS. 2A–2C, there is schematically shown the formation of a thin-film dielectric layer on a substrate applying steps of the inventive method. A substrate 10 is first provided, such as a crystalline Si substrate (FIG. 2A), having a top surface 12a at a certain distance "$D_o$" relative to the bottom surface 12b of the substrate. The substrate may have source and drain regions disposed therein, e.g., p-type regions formed by implantation with boron ions and n-type regions formed by implantation with arsenic or phosphorus ions.

A thermally-grown silicon oxide film 14 having a thickness of about 1000 Å may be formed on the substrate using furnace oxidation. In performing furnace oxidation, the substrate may be held within a reaction tube adjacent a furnace, such as a resistance-heater, and then gas such as dry $O_2$ may be injected into the reaction tube and passed over the substrate while it is maintained at an elevated temperature (e.g., preferably about 1000° C.). This furnace oxidation preferably is carried out over a period of hours, e.g., up to three hours. The $O_2$ reacts with the Si of the substrate to form a base dielectric layer 14 of $SiO_2$ (FIG. 2B). The Si—$SiO_2$ interface 15 is disposed at a distance $D_i$ from the bottom surface 12b of the substrate, which is smaller than $D_o$ due to the reaction of $O_2$ with the Si substrate to form the $SiO_2$ layer. A poly-crystalline Si layer 18 may be formed on the top surface of the thermally grown $SiO_2$ base layer.

Next, an etchant such as dilute HF is applied to etch the base layer back to a thickness desired for the intended use (FIG. 2C), e.g., for DRAM applications it may be advantageous to etch the base layer down to about ~20 Å or even down to ~15 Å. The top oxide surface including the layer of poly-Si 18 is removed but the Si—$SiO_2$ interface 15 is left in tact. The base layer may be etched down to a surface line 20 beneath the boundary line defined by the original silicon surface (e.g., hatched line 22 of FIG. 2C).

With this method, a long growth time and high temperatures are used to improve the oxide quality, e.g., to reduce the surface defect states. In prior RTO methods, to obtain a 15 Å film, temperatures of about 1000° C. have been used but the growth time is limited to about ten seconds. With typical furnace oxidation processes, the growth of a 15 Å film is achieved substantially as the temperature is ramped-up to less than 800° C.; in this case an undesirable oxide layer may be formed on the surface of the dielectric film, e.g., the $SiO_2$ surface, and this layer may have a thickness of up to ~12 Å. In comparison, with this method, since the initial base layer is grown to a thickness greater than desired and greater than the thickness of dielectric layers grown with previous methods, a growth time of about 30 minutes to up to three hours or more may be used during which high temperatures of about 1000° C. are maintained. The long growth time and high temperatures aid in removing the surface defect states and provide for an improved oxide quality.

Figure 3A:
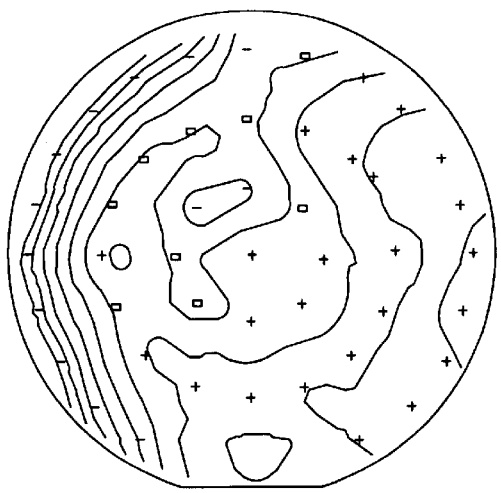
FIGS. 3A–3C illustrate custom template measurement results for dielectric films grown with RTO (FIG. 3A) and with the present method before (FIG. 3B) and after (FIG. 3C) the etch back.
Figure 3B:
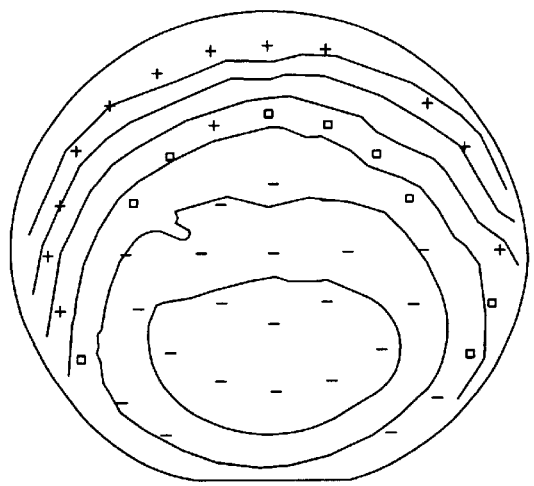
Figure 3C:
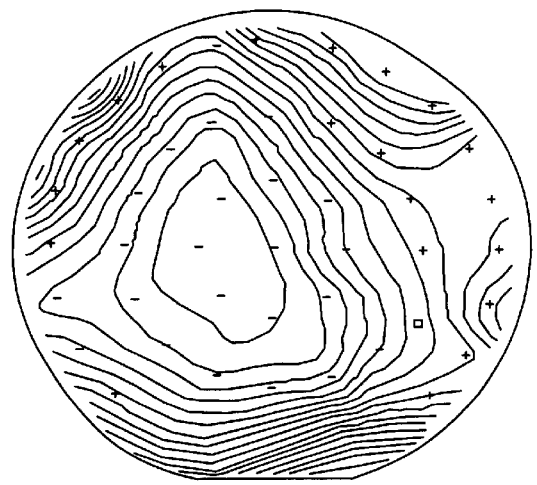

For example, a ~15 Å film may be obtained maintaining 2-percent uniformity in film thickness throughout the film. Referring to FIGS. 3A–3C, there are shown custom template measurement results for dielectric films grown with RTO (FIG. 3A) and with the present method before (FIG. 3B) and after (FIG. 3C) the etch back. In FIG. 3A, the mean thickness of the layer is 19.49 Å, with a minimum thickness of 18.37 Å, a maximum thickness of 20.22 Å, and a standard deviation of 0.47 Å. In FIG. 3B, the mean thickness of the layer is 100.39 Å, with a minimum thickness of 98.92 Å, a maximum thickness of 102.43 Å, and a standard deviation of 0.99 Å. In FIG. 3C, the mean thickness of the layer is 17.22 Å, with a minimum thickness of 16.21 Å, a maximum thickness of 18.72 Å, and a standard deviation of 0.66 Å. The layer produced with the inventive method (FIG. 3C), has a greater uniformity in thickness. Since the wet etch technique is uniform, the uniformity is carried through to the final oxide thickness.

It is understood that the embodiments described herein are merely exemplary and that a person skilled in the art may make variations and modifications without departing from the spirit and scope of the invention. All such variations and modifications are intended to be included within the scope of the appended claims.

What is claimed is:

1. A method for growing a thin-film dielectric layer of a desired thickness of 20 Å or less on a substrate, comprising (a) growing a base layer consisting essentially of silicon oxide dielectric material on the substrate wherein the base layer has a thickness exceeding the desired thickness, and (b) etching back the base layer to the desired thickness of 20 Å or less.

2. The method of claim 1 in which the step of growing the base layer comprises growing a $SiO_2$ layer.

3. The method of claim 2 in which the $SiO_2$ layer is grown by furnace oxidation.

4. The method of claim 3 in which the $SiO_2$ layer has a thickness of from about 50 Å to about 200 Å.

5. The method of claim 3 in which the furnace oxidation is performed with temperatures of about 900° C. to 1100° C. and with gas compositions selected from dry oxygen $O_2$ and $SiH_4+O_2$ in the absence of a nitrogen-bearing ambient.

6. The method of claim 1 in which the step of etching back the base layer to the desired thickness comprises applying wet chemical etchants selected from HF, $K_4Fe(CN)_6$, $K_3Fe(CN)_6$, $Na_2S_2O_3$, KOH in $H_2O$, and a $HF:H_2O$ solution.

7. The method of claim 1 in which the desired thickness is less than 20 Å.

8. A method of making a thin-film dielectric layer of a desired thickness on a substrate for use in fabricating a semiconductor device, the method comprising:

providing the substrate;

growing a base layer consisting essentially of silicon oxide dielectric material on the substrate wherein the base layer has a thickness exceeding the desired thickness, and etching back the base layer to the desired thickness, whereby a dielectric layer having a thickness of less than 20 Å is provided having substantial uniformity across its surface with a standard deviation in surface contours of less than 7 Å without performing a post-etching anneal.

9. A method of making a thin-film dielectric layer of a desired thickness on a substrate for use in fabricating a semiconductor device, the method comprising:

providing a silicon substrate;

growing a base layer of dielectric material on the substrate wherein the base layer has a thickness exceeding the desired thickness, and etching back the base layer to the desired thickness, whereby a dielectric layer having a thickness of less than 20 Å is provided.

10. The method of claim 9, in which the step of growing the base layer comprises oxidizing the substrate by furnace oxidation at temperatures of about 900° C. to 1100° C. for a period of about two to three hours and with gas compositions selected from dry oxygen $O_2$ and $SiH_4+O_2$.

11. The method of claim 1 in which the substrate is provided with source and drain regions implanted therein and wherein one or more gate electrodes are deposited on the substrate or dielectric material to define a transistor.

* * * * *